United States Patent
Azordegan et al.

(10) Patent No.: US 7,015,468 B1
(45) Date of Patent: Mar. 21, 2006

(54) METHODS OF STABILIZING MEASUREMENT OF ARF RESIST IN CD-SEM

(75) Inventors: Amir Azordegan, Santa Clara, CA (US); Gian Francesco Lorusso, Fremont, CA (US); Ananthanarayanan Mohan, Santa Clara, CA (US); Mark Neil, San Jose, CA (US); Waiman Ng, Los Gatos, CA (US); Srini Vedula, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 150 days.

(21) Appl. No.: 10/807,899

(22) Filed: Mar. 24, 2004

Related U.S. Application Data

(60) Provisional application No. 60/457,535, filed on Mar. 25, 2003.

(51) Int. Cl.
*H01J 37/26* (2006.01)
*G01N 23/225* (2006.01)

(52) U.S. Cl. .................................. 250/307; 250/310
(58) Field of Classification Search ............... 250/307, 250/310
See application file for complete search history.

(56) References Cited

U.S. PATENT DOCUMENTS

| | | | |
|---|---|---|---|
| 6,066,849 A | 5/2000 | Masnaghetti | 250/310 |
| 6,730,458 B1 * | 5/2004 | Kim et al. | 430/296 |
| 6,774,044 B1 * | 8/2004 | Ke et al. | 438/706 |

* cited by examiner

Primary Examiner—Jack I. Berman
(74) Attorney, Agent, or Firm—Deborah W Wenocur

(57) ABSTRACT

A method of improving stability for CD-SEM measurements of photoresist, in particular 193 nm photoresist, and of reducing shrinkage of 193 nm photoresist during CD-SEM measurements.

The photoresist is exposed to a dose of electrons or other stabilizing beam prior to or during CD measurement. One embodiment of the invention includes multiplexing of the SEM electron beam.

20 Claims, 11 Drawing Sheets

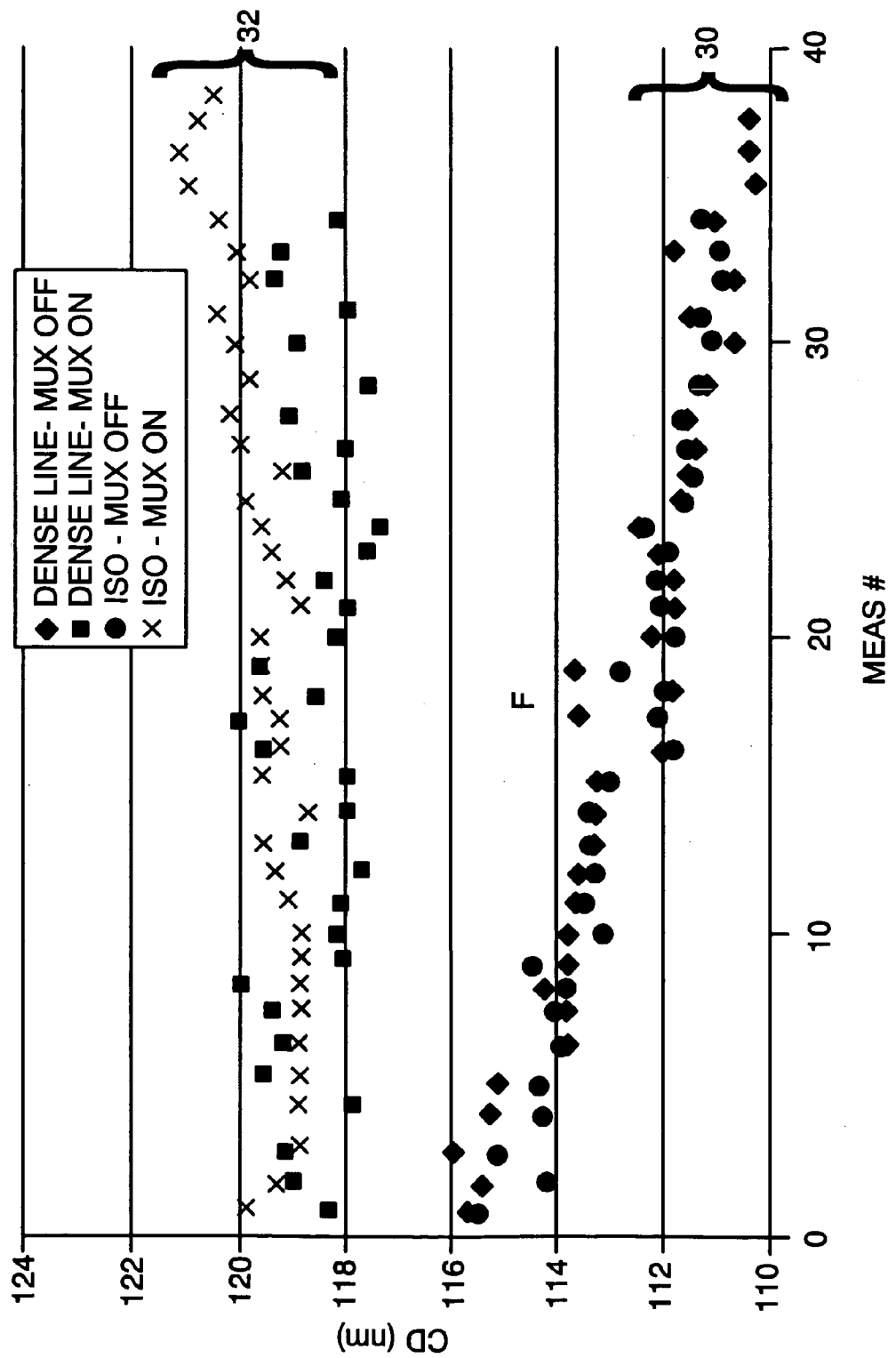

METHODS OF STABILIZING MEASUREMENT OF ARF RESIST IN CD-SEM

CROSS REFERENCE TO RELATED APPLICATIONS

This application is related to U.S. Provisional Application No. 60/457,535 filed on Mar. 25, 2003, and claims priority therefrom.

FIELD OF THE INVENTION

This invention pertains to measurement of resist features using Scanning Electron Microscopes, and in particular to methods for reducing instability in the measurement of the resist features.

BACKGROUND OF THE INVENTION

As integrated circuits become smaller and faster, the critical dimensions (CD's) of the devices and interconnections also must decrease. As these CD's get closer to the resolution limits of optical lithography and microscopy measurement techniques, great care must be taken to eliminate all possible sources of measurement error in order to obtain accurate and reproducible CD's. One nearly universally used measurement technique is Scanning Electron Microscopy (SEM), which utilizes highly focused beams of electrons impinging on the sample and measures the yield of secondary emitted electrons. SEM is the most widely used tool for Very Large Scale Integration (VLSI) measurement and morphology analysis, due to its high resolution and relative ease of use.

FIG. 1a depicts an SEM system, showing electron beam (80) from electron source (100) impinging onto sample (90), and the acceleration (102), focusing (104), scanning (105) and detection (106) electronics. FIG. 1b shows a typical electron emission energy spectrum resulting from the incident electron beam of an SEM. The highest energy peak (108) results from the backscattered electrons, which have energies close to that of the incident beam, and which have undergone only elastic collisions with the target atoms. Peaks 110 seen at intermediate energies are the Auger electrons emitted due to relaxation of electrons between atomic energy levels. The lowest energy emitted electrons (112), produced by inelastic collisions between the primary beam and the inner shell electrons of the sample, are known as the secondary electrons and are generally the most useful for morphology studies in VLSI. This is due in part to the extremely short escape depth (less than about 50 Angstroms) of secondary electrons, which yields high surface sensitivity. In addition, since the incident electron beam undergoes beam broadening due to multiple collisions as it penetrates into the sample, the backscattered electrons originating from deeper into the sample reflect this broadening with degraded point-to-point resolution. The lower energy secondary electrons which escape the sample originate from the surface region above the penetration depth where beam broadening becomes influential, and therefore yield higher point-to-point resolution than evidenced by backscattered electrons.

The detected electron current, typically chosen to be the secondary electron current as described above, is used to intensity modulate the z-axis of a Cathode Ray Tube (CRT). An image of the sample surface is produced by raster scanning the CRT screen and the electron beam of the SEM. The contrast of the image depends on variations in the electron flux arriving at the detector, and is related to the yield of emitted electrons per incident electron. The yield is dependent on both the work function of the material and the surface curvature. These factors allow the SEM to distinguish between materials such as photoresist, metal, oxide, and silicon, and also to distinguish surfaces which differ in slope. Thus, CD's of patterned and/or etched lines and gaps can be measured.

Two important factors affecting the accuracy and reproducibility of SEM measurements of CD's in photoresist layers are resist shrinkage and charging effects. Resist shrinkage can occur due to such factors as elevated temperatures or evaporation, crosslinking of the polymer chains, purely thermal reactions, diffusion of acid and subsequent deprotection, or solvent loss.

Charging effects are also a cause of unstable and inaccurate SEM measurement results. When the number of emitted secondary electrons is different from the number of incident electrons, the surface scanned by the beam acquires excess charge, which may be retained, particularly in the case of exposed insulating surfaces. This will cause the incident beam trajectory to be disturbed, and will therefore degrade the image and destabilize the measurements. Additionally, charging of the surface may contribute to resist shrinkage, by enhancing causative factors such as polymer crosslinking.

Present technology utilizes 193 nm photoresist for patterning in the 130 nm–100 nm range. Standard 193 nm resist is generally Argon-Fluoride resist (ARF). 193 resist is known to shrink substantially when exposed to an electron beam. Consequently, it yields poor measurement precision if no correction is used. A method for stabilizing CD-SEM measurements on ArF resist layers would be of great utility in current semiconductor manufacturing technology.

SUMMARY OF THE INVENTION

It is therefore an object of this invention to provide a method of improving stability for CD-SEM measurements of photoresist, in particular 193 nm photoresist.

It is a further object of this invention to provide a method of reducing shrinkage of 193 nm photoresist during CD-SEM measurements.

These objects are met by exposing the photoresist to a dose of electrons or other stabilizing beam prior to or during CD measurement. One embodiment of the invention includes multiplexing of the SEM electron beam.

BRIEF DESCRIPTION OF THE DRAWINGS

FIG. 6b shows CD measurements of 193 resist, with LE=200 eV, with and without MUX in charge compensation mode.

DETAILED DESCRIPTION OF THE INVENTION

Figure 1A:
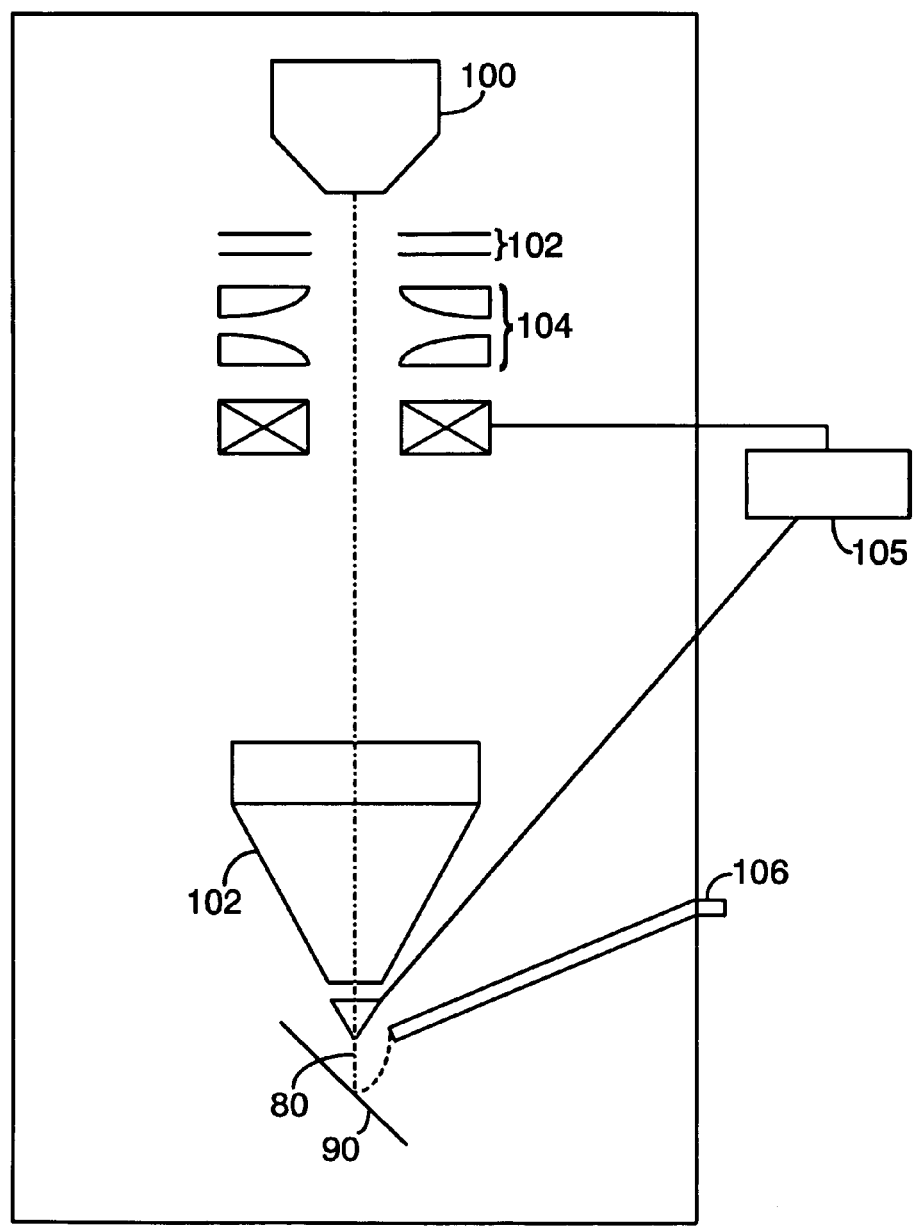
FIG. 1a depicts an SEM system.
Figure 1B:
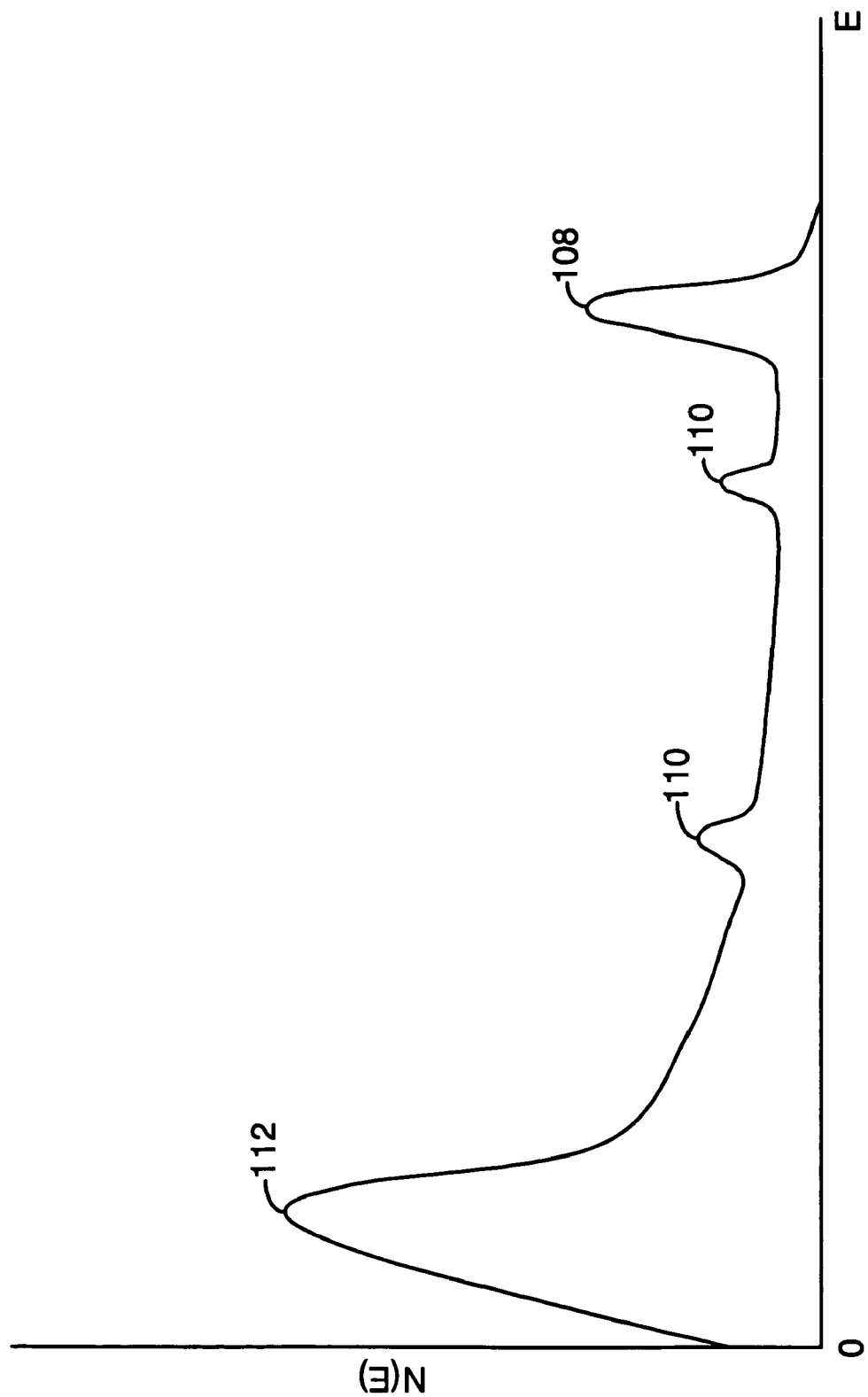
FIG. 1b shows a typical electron emission energy spectrum resulting from the incident electron beam of an SEM.
Figure 1C:
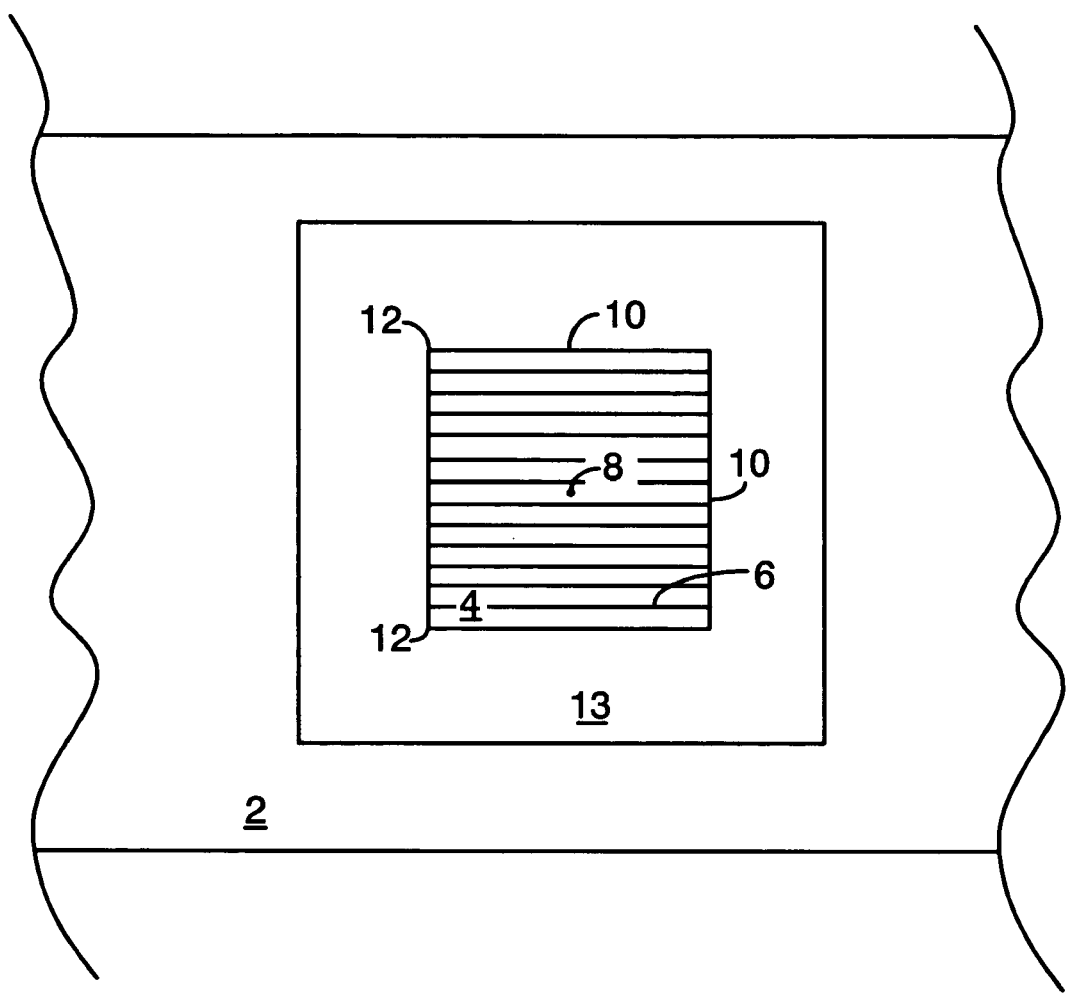
FIG. 1c illustrates the flood and image modes in SEM technology.

A method of obtaining automated CD-SEM measurements utilizes "multiplexing" of the electron beam, hereinafter referred to as MUX, which may be used in many SEM applications. This technique is capable of dynamically eliminating surface charging caused by the electron beam on the surface. FIG. 1c illustrates the definition of imaging and flood modes in SEM technology, needed to introduce the concept of beam multiplexing. A top view of a portion of a sample surface 2 is shown. Image region 4 is the portion of sample surface 2 to be imaged by the SEM electron beam. Variable parameters for the imaging electron beam include Landing Energy (LE), i.e., the energy with which the electrons impinge on the sample, Beam Current (BC), and magnification, i.e., the spread of the beam. The dose is determined by the BC and the magnification.

Within image region 4 the electron beam is raster scanned as shown by raster lines 6. This mode is defined as "imaging mode". In order to have uniform charge distribution at the corners 12, edges 10, and center 8 of the image region, a step is interposed between successive imaging mode steps, whereby a flood region 13, which includes but is substantially larger than image region 4, is flooded with impinging electrons. This mode is defined as "flood mode". Typical image regions may be on the order of 2–4 microns squared, and typical flood regions may be on the order of 64 microns squared. In MUX technology, the LE, BC, and magnification parameters can be set independently in flood mode as well as in image mode. In its simplest configuration, MUX is used to equalize charge distribution across the image region, and the LE is maintained at the same value for both the imaging step and the flood step.

Figure 2:
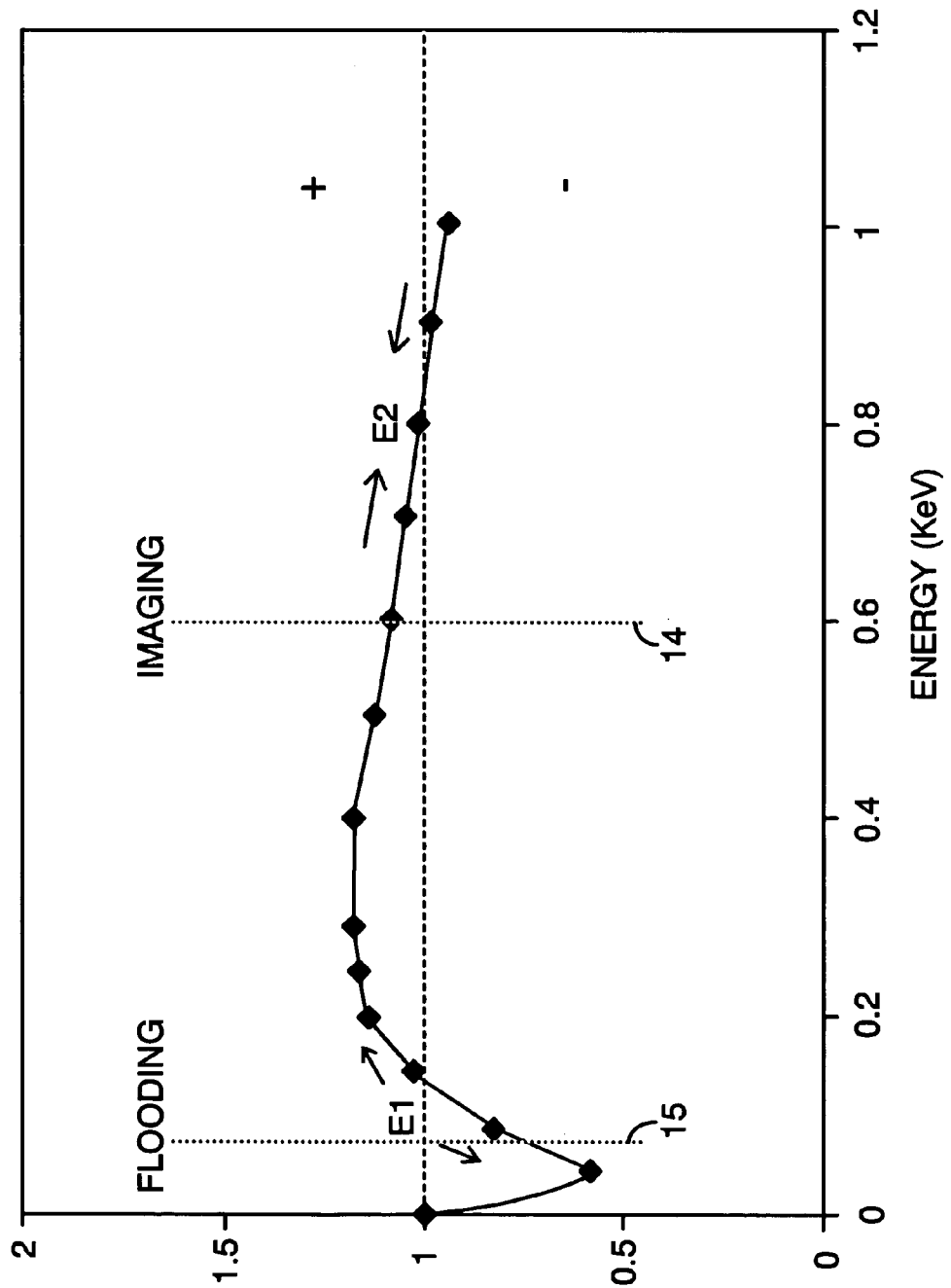
FIG. 2 is an exemplary graph of secondary electron yield vs. Landing Energy.

In order to eliminate the surface charge created by the interaction of the electron beam with the sample, it is necessary to utilize different LE during flood mode vs. imaging mode. FIG. 2 is a graph of secondary electron yield vs. LE. Yield equals 1 at LE values E1 and E2, approximately 170 eV and 800 eV respectively for this example. The details of the graph, including the values for E1 and E2, are material dependent, but the general configuration is similar for most materials. In the range between E1 and E2, yield is greater than 1, thereby causing a net positive charging effect. For LE lower than E1, yield is less than 1, causing a net negative charging effect. If imaging is performed at LE value 14 with yield greater than 1, and flooding is performed at LE value 15 with yield less than 1, the negative charge accumulated during the flood step can be adjusted to balance the positive charge accumulation during the imaging step, thereby obtaining effective charge compensation. The use of MUX, in general and in specific for varying the LE so as to provide charge compensation, is described in commonly owned U.S. Pat. No. 6,066,849, which is hereby incorporated by reference in its entirety.

In a first embodiment of our invention, a novel utilization of the MUX methodology during automated SEM metrology pre-doses the resist with electrons so as to pre-shrink the resist into a stable region, and thereby to stabilize subsequent CD measurements. The pre-shrinking is believed to be due to such factors as polymer cross-linking and solvent loss. The pre-dosing is accomplished, in this embodiment, by multiplexing the electron beam at an LE for flood mode which may be the same as or different than the LE for image mode, and by utilizing a relatively higher beam current during flood mode compared to image mode so as to minimize the time for a given dose, before executing a set of measurements. It should be evident to those skilled in the field that the use of higher beam current in flood mode in this embodiment is preferred so as to optimize throughput, but not strictly necessary. An alternative sub-embodiment includes similar pre-dosing in-situ in a CD-SEM accomplished without any multiplexing, with substantially slower throughput.

Figure 3A:
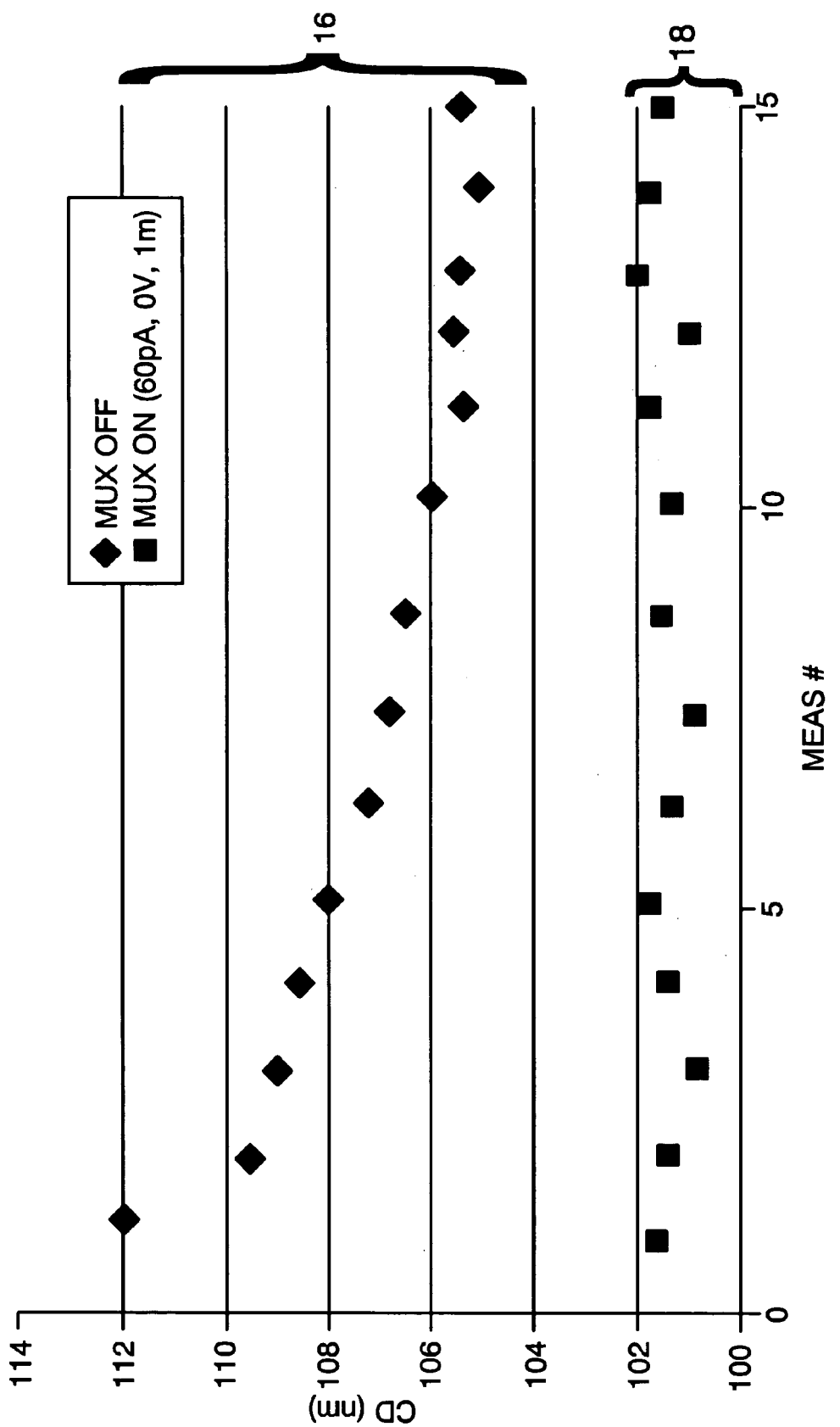
FIG. 3a is a graph of measured 193 resist CD's vs. measurement number with and without MUX, for 60 pA BC in flood mode.

FIG. 3a shows two sets of CD measurements of 193 resist taken using SEM equipment and measurement methods as described in earlier cited U.S. Pat. No. 6,066,849. The first measurement set is taken without pre-dosing by MUX, the second set is taken after MUX pre-dosing at 60 pA beam current for flood mode, 0V landing energy, for 1 minute. BC for image mode is 30 pA LE for image mode is 600 V. Measurement set 16 without MUX pre-dosing consists of 15 measurements taken on a first site at LE=600 V and BC=30 pA for both image and flood mode, and shows measured CD's decreasing from 112 nm for the first measurement, down to 106 nm for the 15$^{th}$ measurement. In contrast, measurement set 18 after MUX predosing of a second site consists of 15 measurements taken on the second site, and shows measured CD's remaining essentially constant at 102 nm. Measurement stability is seen to be greatly improved by the MUX predosing.

Figure 3B:
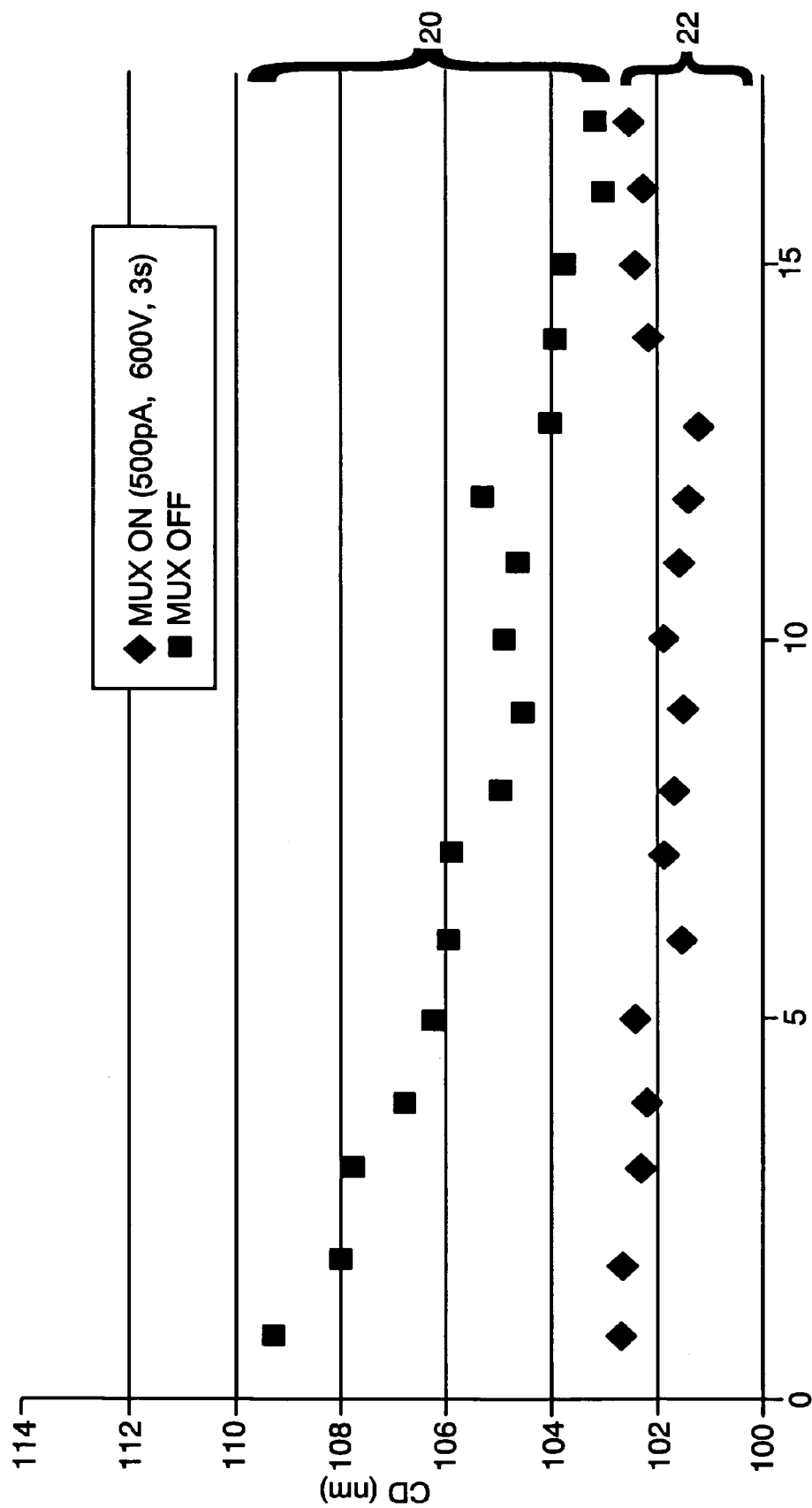
FIG. 3b is a graph of measured 193 resist CD's vs. measurement number with and without MUX, for 500 pA BC in flood mode.

FIG. 3b shows two sets of CD measurements of 193 resist, the first set being taken without pre-dosing by MUX, the second set being taken after MUX pre-dosing at 500 pA beam current in flood mode, and 600V landing energy, for 3 seconds. Standard LE (600 V) and BC (30 pA) values are used in image mode. In this case, only the beam current is multiplexed, and the same magnification is used during the flood and the imaging steps. Measurement set 20 without MUX pre-dosing consists of 17 measurements taken on a first site, and shows measured CD's decreasing from 109 nm for the first measurement, down to 103 nm for the 17$^{th}$ measurement. In contrast, measurement set 22 after MUX pre-dosing of a second site consists of 17 measurements taken on the second site, and shows measured CD's remaining essentially constant at 102 nm. These results indicate the possibility of reducing the pre-dosing exposure time by increasing the beam current and landing energy in flood mode, without adversely affecting the resulting stability improvements in the CD measurements.

Figure 3C:
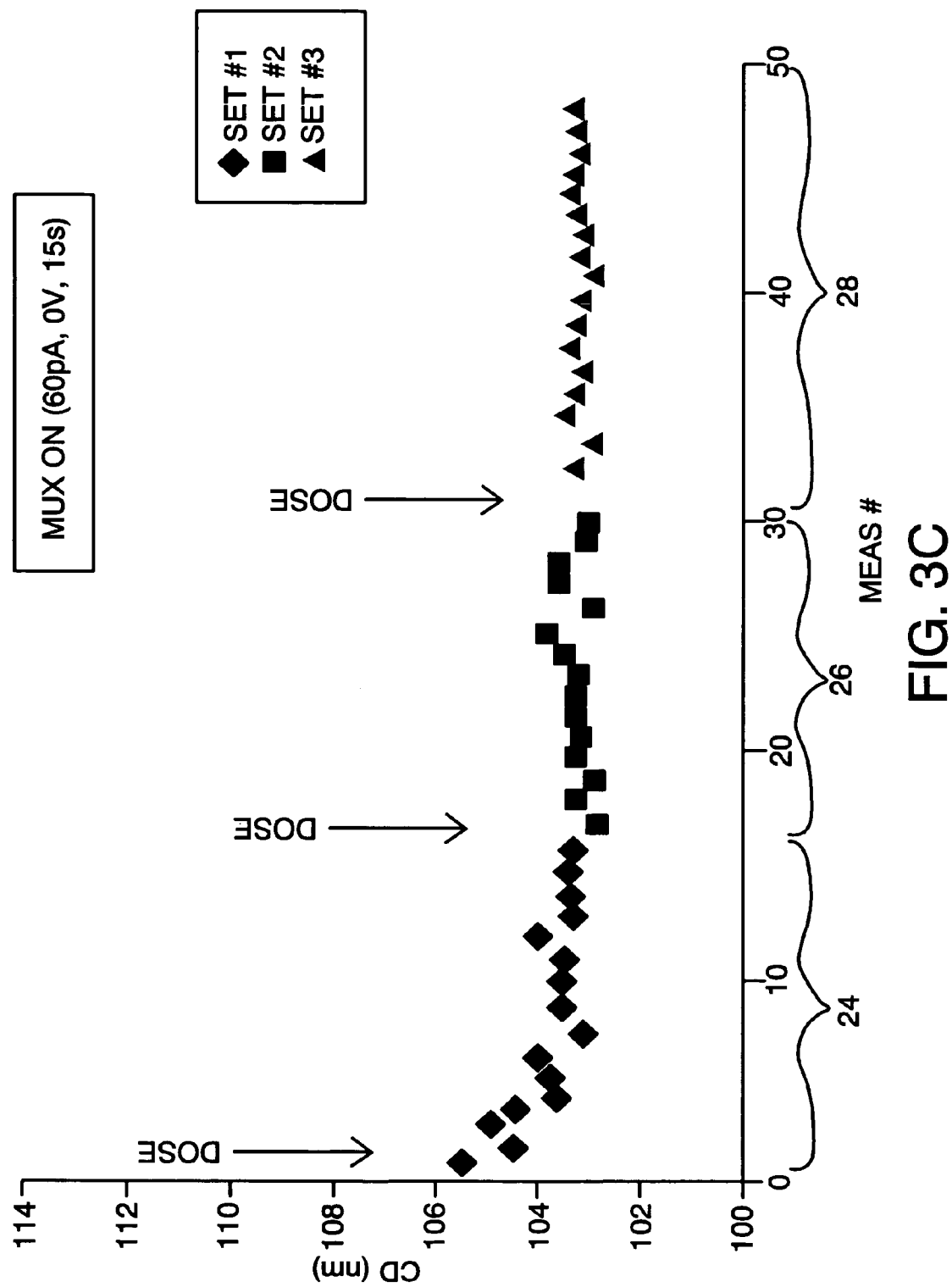
FIG. 3c is a graph of measured 193 resist CD's showing the effect of successive pre-dosing steps when re-measuring the same site.

FIG. 3c shows the effect of successive pre-dosing steps when re-measuring the same site. Measurement set 24 is taken after a first pre-dosing at 60 pA beam current in flood mode, 0V landing energy, for 15 seconds. Standard BC and LE values are used in image mode. Measurement set 26 is taken after a second predosing at the same parameters, and measurement set 28 is taken after a third predosing at the same parameters. After the first predosing, measurement set 24 shows CD's decreasing from about 105 nm to about 103 nm. The shorter predosing exposure time for measurement set 24 (15 seconds compared with 1 minute for the measurements of FIG. 3a, at the same beam current) results in some residual shrinkage, about 2 nm, after the first predosing of FIG. 3c, compared to FIG. 3a where there is no observable residual shrinkage for the predosed resist. Measurement sets 26 and 28 following the second and third predosing steps remain essentially constant at about 103 nm. This shows that the initial predosing has the largest effect on the measurements directly following, and that successive measurements of the same site will give essentially the same result even with additional predosing, thus evidencing greatly improved measurement stability.

Figure 4:
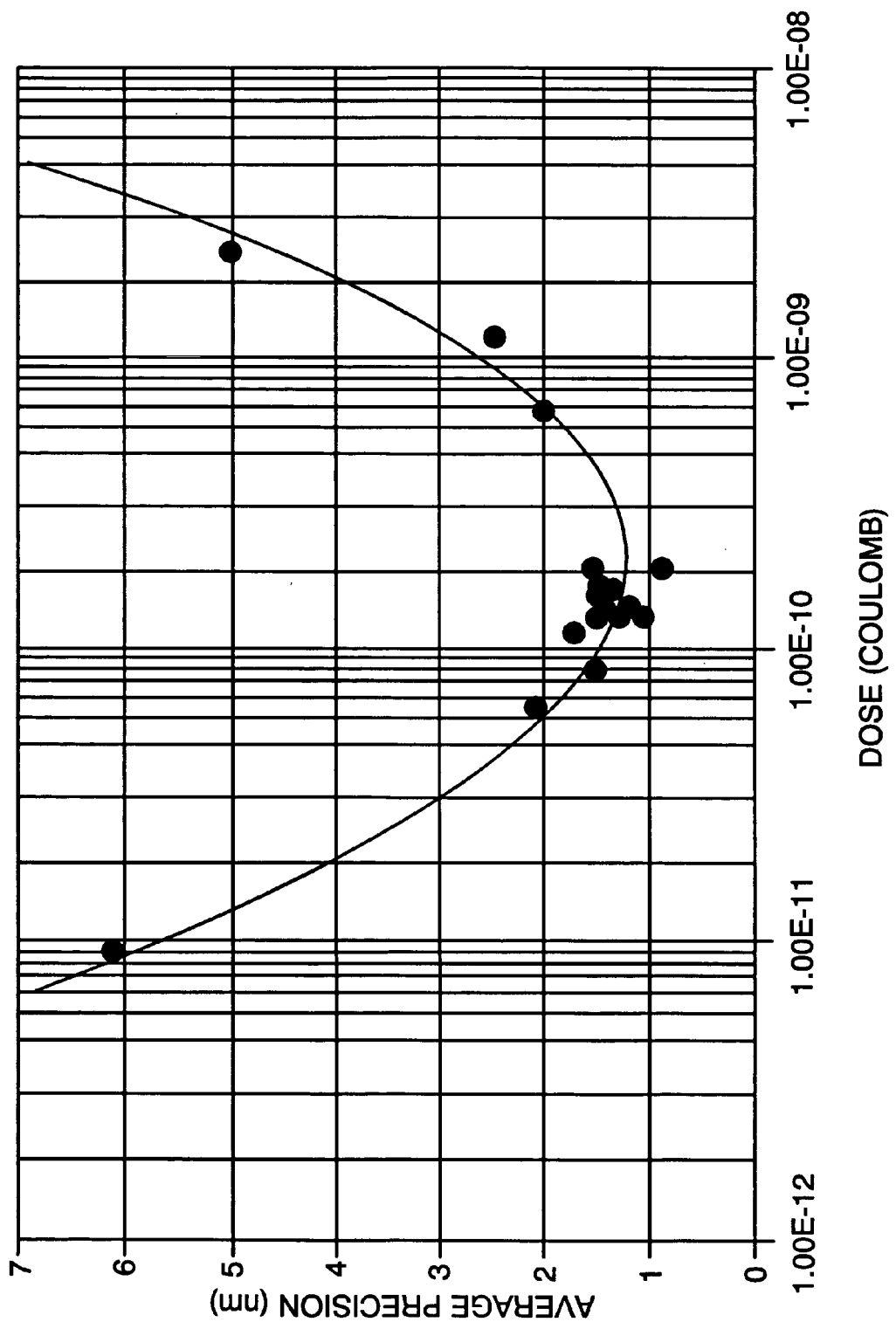
FIG. 4 is a graph of total dose of the pre-dose step vs. average measurement precision on a 193 resist-patterned wafer.

FIG. 4 is a graph of total dose of the pre-dose step vs. average measurement precision from 5 different sites on a 193 resist-patterned wafer. Optimal pre-dose has been determined to be about 1.5 E-10 Coulomb, with an average measurement precision of about 1 nm (3 sigma). Our preliminary results indicated optimal flood frame settings of about 100 k×magnification, 30 pA BC, and 450 frames predosing exposure at 8 msec/frame. It is believed that too low a dose causes imprecision due to additional resist shrinkage after the pre-dosing, whereas at too high a dose, imprecision resurfaces due to dynamic carryover between cycles, believed to be caused by electrostatic carbon deposition or contamination. This demonstrates the need to use a pre-dosing regimen optimizing measurement precision while minimizing sample dosing.

Figure 5:
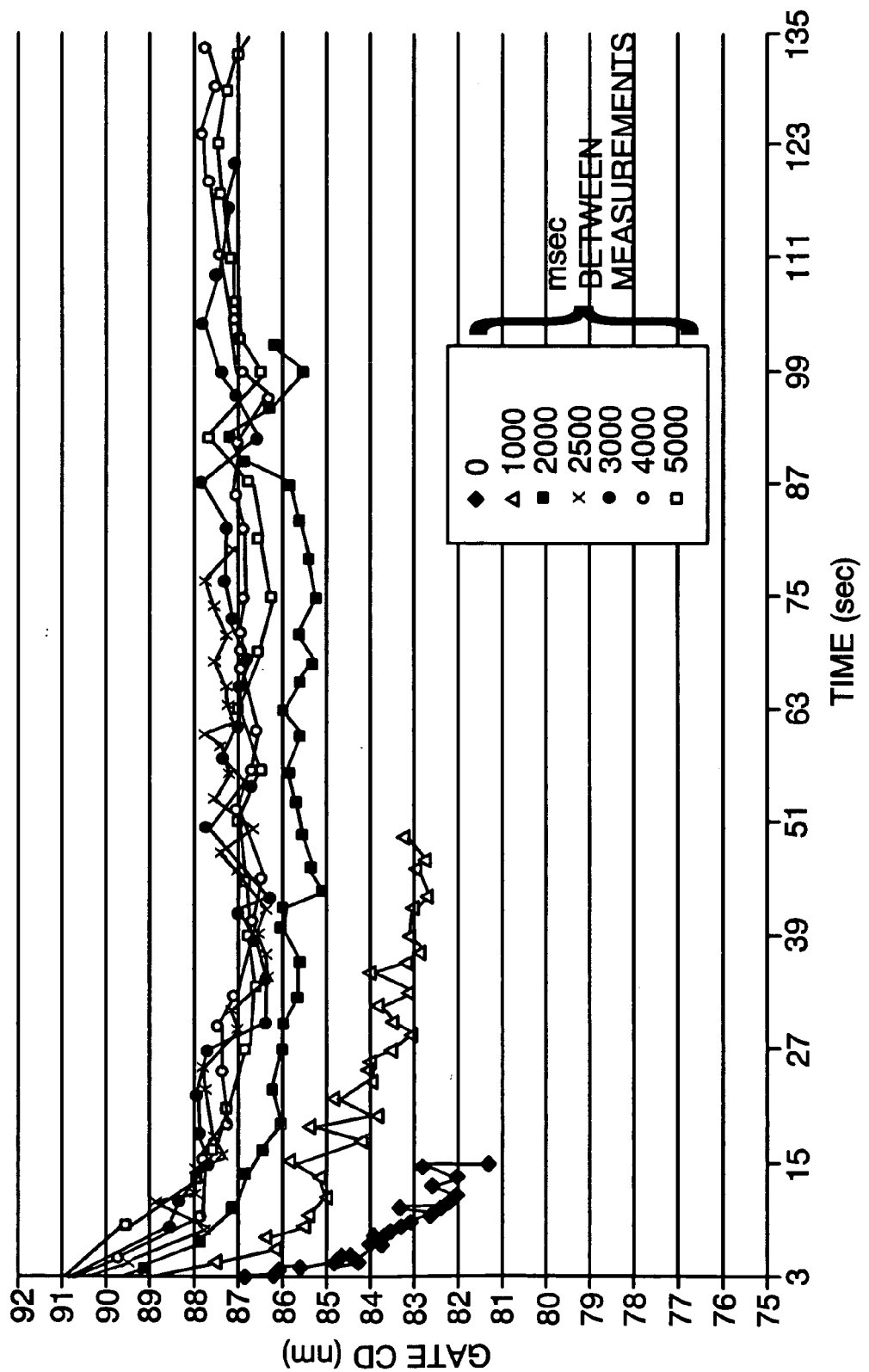
FIG. 5 shows a set of CD measurements from 193 resist taken during pre-dosing at 400 V LE and 20 pA BC for with differing time delays between measurements.

A second embodiment of our invention utilizes a minimal pre-dosing exposure of 193 resist to e-beam, followed by a delay during which e-beam induced resist shrinkage occurs and stabilizes. In this case, our preliminary analysis indicated an optimal stabilizing delay in the range between 8 and 15 seconds. FIG. 5 illustrates this embodiment. Each curve shows a set of CD measurements taken using 400 V LE and 20 pA BC, with differing time delays between measurements. These results indicate that, when enough time is allowed (to dissipate the heat, for example), an extremely low dose will successfully stabilize the measurements. The results in FIG. 5 were obtained by using 2 frames at 20 pA, corresponding to a dose of $3.2 \times 10^{-13}$ C, three orders of magnitude lower than the optimal dose using the pre-dosing strategy. An advantage of this embodiment is that it minimizes damage to the resist.

A third embodiment of our invention utilizes MUX technology in charge compensation mode to minimize charging during 193 resist CD measurements. It has been determined that charging can affect resist shrinkage, for example by increasing the likelihood of polymer cross linking and matrix deformation. This embodiment may be implemented either with or without pre-dosing according to the above-described embodiments.

Figure 6A:
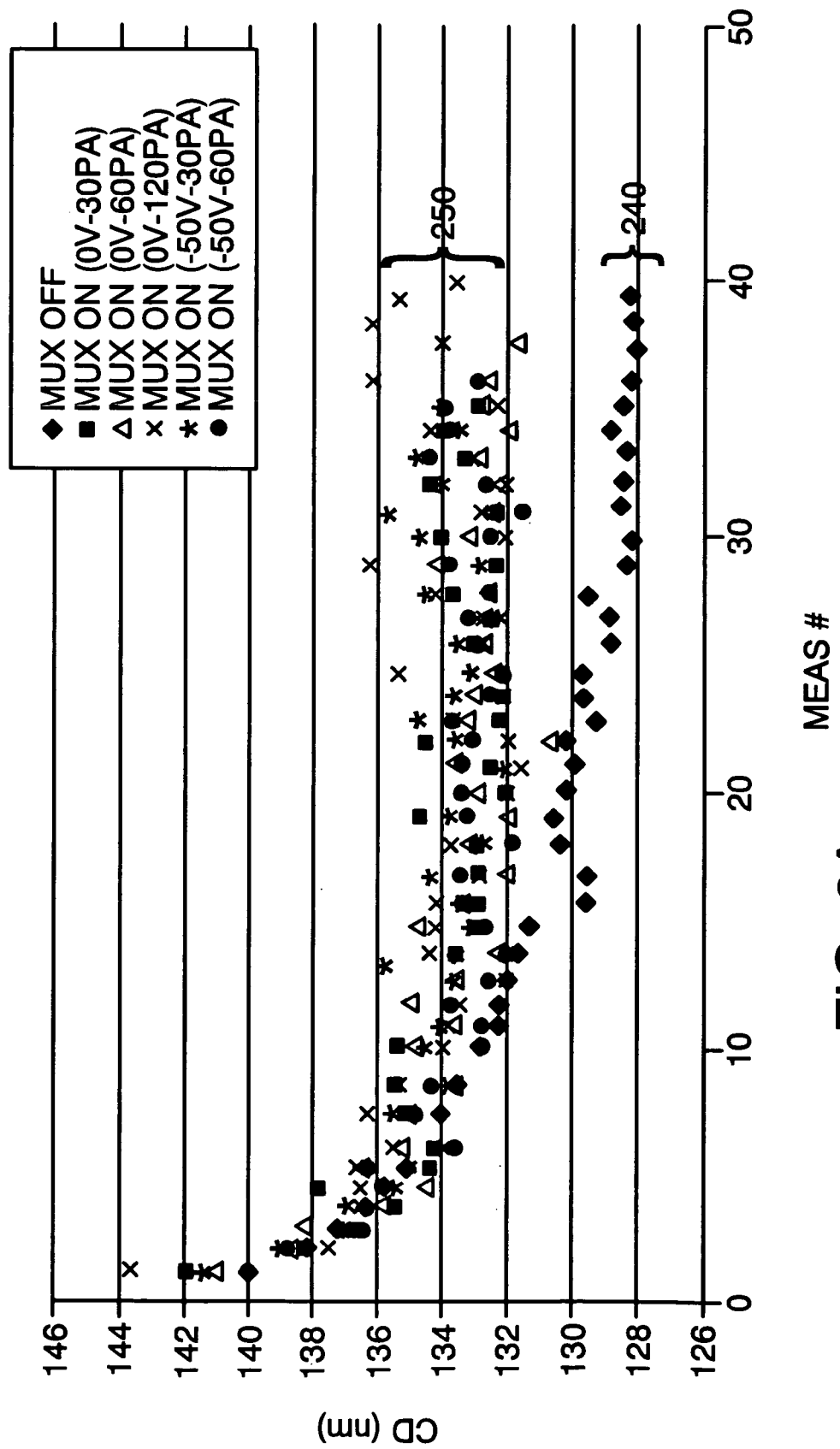
FIG. 6a shows CD measurements of 193 resist at LE=600 eV, with and without MUX in charge compensation mode.

FIG. 6a shows CD measurements of 193 resist at LE=600 eV and BC=30 pA in image mode, with and without MUX in flood mode. Without MUX (curve 240) the resist shrinkage is about 14 nm and still increasing after 40 measurements. With each of the MUX measurements (curves 250, with differing parameters, but all in charge compensation mode), the resist shrinkage stabilizes at about 8 nm after 8–10 measurements.

FIG. 6b shows two sets of CD measurements of 193 resist, the first set being taken without MUX with LE=200 eV and BC=30 pA, the second set being taken with MUX on at 30 pA beam current and 0V landing energy for flood mode, 200 eV LE and 30 pA BC for image mode. Measurement set 30 without MUX consists of measurements taken on a first site, and shows measured CD's decreasing from 116 nm down to 110 nm. In contrast, measurement set 32 with MUX on consists of measurements taken on the second site, and shows measured CD's remaining essentially constant at about 119 nm. This data indicates that observed 193 resist shrinkage at LE=600 V is comprised of two components: 1) a beam energy-induced shrinkage, and 2) a charge-induced shrinkage. Operating at very low LE of 200V greatly reduces the first component, and use of MUX in charge-compensation mode substantially eliminates the second component, yielding very stable CD measurements. In contrast, the data of FIG. 6a shows an initial resist shrinkage due to the higher energy electron beam, followed by stable results (with MUX only) when charging-induced shrinkage becomes dominant.

The embodiments of the invention described herein show several methods of stabilizing CD measurements of 193 resist in a CD-SEM. These methods enable improvement of measurement precision to about 1 nm, without necessity for correction. The embodiments include: 1) high pre-dosing, with or without MUX, so as to put the resist into a stable condition before measurement; 2) low pre-dosing combined with stabilization time and time management between measurements; and 3) use of MUX to minimize charge-induced shrinkage. The above choices permit a fine tuning of the conditioning of the resist line.

The invention is not to be restricted to the exact embodiments described herein. It should be apparent to those skilled in the art that changes and modifications can be made without departing from the spirit of the invention. By way of example, pre-dosing may be accomplished by means other than exposure to an electron beam. It is believed that UV exposure or exposure to other charged particle beams such as ion beams or to plasma may be utilized to stabilize resist measurements. It is believed that the method may be used on types of resist other than 193 nm ArF resist. The scope of the invention should be construed in view of the claims.

We claim:

1. A method for stabilizing CD measurements of a photoresist feature on a surface of a semiconductor wafer portion in a CD-SEM, comprising the steps of:
    installing said wafer portion in said CD-SEM;
    exposing said photoresist feature to a pre-dose of energy selected from the group consisting of: radiation and an energetic particle beam, for a specified time period; and
    following said step of exposing said photoresist feature to said pre-dose of energy, measuring said CD of said photoresist feature.

2. The method of claim 1, wherein said step of exposing said photoresist feature to a pre-dose of energy comprises exposing said photoresist feature to UV radiation.

3. The method of claim 1, wherein said step of exposing said photoresist feature to a pre-dose of energy comprises exposing said photoresist feature to a charged particle beam.

4. The method of claim 3, wherein said charged particle beam is selected from the group consisting of: e-beam, ion beam, and plasma.

5. The method of claim 4, wherein said charged particle beam is an e-beam.

6. The method of claim 5, wherein said photoresist feature is an ArF resist feature.

7. The method of claim 6, wherein said step of exposing said ArF resist feature to a pre-dose of energy comprises exposing said ArF resist feature to a pre-dose of energetic electrons from an electron beam at a beam Landing Energy (LE), a Beam Current (BC) and a magnification, for a specified time period.

8. The method of claim 7, wherein said pre-dose is sufficiently high to pre-shrink said ArF resist feature such that subsequent CD measurements of said ArF resist feature remain substantially stable.

9. The method of claim 8 wherein said pre-dose is on the order of 1.5 E-10 Coulomb.

10. The method of claim 8, wherein said step of exposing said ArF resist feature to a pre-dose of energetic electrons from an electron beam comprises interspersing a flooding step at a first beam Landing Energy (LE), a first Beam Current (BC) and a first magnification, with an imaging step at a second beam Landing Energy, a second Beam Current, and a second magnification.

11. The method of claim 10, wherein said step of exposing said ArF resist feature to a pre-dose of energetic electrons from an electron beam by interspersing a flooding step at a first beam Landing Energy (LE), a first Beam Current (BC) and a first magnification, with an imaging step at a second beam Landing Energy, a second Beam Current, and a second magnification, includes beam multiplexing.

12. The method of claim 11, wherein said beam multiplexing is operated in charge compensation mode wherein imaging is performed at a LE value having an electron yield greater than 1, and flooding is performed at a LE value having a yield less than 1, such that the negative charge accumulated during the flood step is adjusted to balance the positive charge accumulation during the imaging step.

13. The method of claim 7, wherein said pre-dose is a minimal trigger dose in the range between $10^{-14}$ C and $10^{-12}$ C, and further including the step of waiting for a stabilizing period of time after said pre-dose before performing said CD measurements.

14. The method of claim 13, wherein said stabilizing period of time is in the range between 8 and 15 seconds.

15. A method for stabilizing CD measurements of a photoresist feature on a surface of a semiconductor wafer portion in a CD-SEM, comprising the steps of:
installing said wafer portion in said CD-SEM;
performing said CD measurements by measuring secondary electrons emitted due to an incident electron beam, said measuring being performed by interspersing a flooding step at a first beam Landing Energy (LE), a first Beam Current (BC) and a first magnification, with an imaging step at a second beam Landing Energy, a second Beam Current, and a second magnification, said first beam Landing Energy and said second beam Landing Energy being independently adjusted to prevent charging of said photoresist feature in such a way as to reduce measured shrinkage of the photoresist.

16. The method of claim 15, wherein said photoresist is an ArF resist.

17. The method of claim 16, wherein said first LE is 0V, said first BC is 30 pA, said second LE is 200 eV, and said second BC is 30 pA.

18. The method of claim 16, further including, before said step of performing said CD measurements by measuring secondary electrons emitted due to an incident electron beam, the step of exposing said ArF resist feature to a pre-dose of energetic electrons from an electron beam at a beam Landing Energy (LE), a Beam Current (BC) and a magnification, for a specified time period wherein said pre-dose is sufficiently high to pre-shrink said ArF resist feature such that subsequent CD measurements of said ArF resist feature remain substantially stable.

19. The method of claim 16, further including, before said step of performing said CD measurements by measuring secondary electrons emitted due to an incident electron beam, the step of exposing said ArF resist feature to a pre-dose of energetic electrons from an electron beam at a beam Landing Energy (LE), a Beam Current (BC) and a magnification, for a specified time period wherein said pre-dose is sufficiently high to pre-shrink said ArF resist feature such that subsequent CD measurements of said ArF resist feature remain substantially stable and wherein said pre-dose is on the order of 1.5 E-10 Coulomb.

20. The method of claim 16, further including, before said step of performing said CD measurements by measuring secondary electrons emitted due to an incident electron beam, the step of exposing said ATF resist feature to a pre-dose of energetic electrons from an electron beam at a beam Landing Energy (LE), a Beam Current (BC) and a magnification, for a specified time period wherein said pre-dose is sufficiently high to pre-shrink said ArF resist feature such that subsequent CD measurements of said ArF resist feature remain substantially stable wherein said step of exposing said ArF resist feature to a pre-dose of energetic electrons from an electron beam comprises interspersing a flooding step at a first beam Landing Energy (LE), a first Beam Current (BC) und a first magnification, with an imaging step at a second beam Landing Energy, a second Beam Current, and a second magnification, and beam multiplexing wherein said beam multiplexing is operated in charge compensation mode wherein imaging is performed at a LE value having an electron yield greater than 1, and flooding is performed at a LE value having a yield less than 1, such that the negative charge accumulated during the flood step is adjusted to balance the positive charge accumulation during the imaging step.

* * * * *